United States Patent
Xie et al.

(10) Patent No.: US 9,412,660 B1
(45) Date of Patent: Aug. 9, 2016

(54) METHODS OF FORMING V0 STRUCTURES FOR SEMICONDUCTOR DEVICES THAT INCLUDES RECESSING A CONTACT STRUCTURE

(71) Applicant: GLOBALFOUNDRIES Inc., Grand Cayman (KY)

(72) Inventors: Ruilong Xie, Niskayuna, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/732,078

(22) Filed: Jun. 5, 2015

(51) Int. Cl.
*H01L 21/768* (2006.01)
*H01L 29/417* (2006.01)
*H01L 21/8234* (2006.01)

(52) U.S. Cl.
CPC .... *H01L 21/76897* (2013.01); *H01L 21/76877* (2013.01); *H01L 21/823425* (2013.01); *H01L 29/41783* (2013.01)

(58) Field of Classification Search
CPC .......... H01L 21/02109; H01L 21/02296; H01L 21/64; H01L 21/70; H01L 21/702; H01L 21/71; H01L 21/8232
See application file for complete search history.

(56) References Cited

U.S. PATENT DOCUMENTS

2015/0249036 A1* 9/2015 Cai ................. H01L 21/76805
257/382

* cited by examiner

*Primary Examiner* — Cheung Lee
(74) *Attorney, Agent, or Firm* — Amerson Law Firm, PLLC

(57) ABSTRACT

One illustrative method disclosed herein includes, among other things, forming a source/drain contact structure between two spaced-apart transistor gate structures, recessing the source/drain contact structure to define a source/drain contact etch cavity and depositing a conformal second layer of insulating material above a first layer of insulating material and in the source/drain contact etch cavity. The method also includes forming a third layer of insulating material above the conformal second layer of insulating material, forming an opening in the conformal second layer of insulating material and forming a V0 via that is conductively coupled to the exposed portion of the recessed source/drain contact structure.

14 Claims, 17 Drawing Sheets

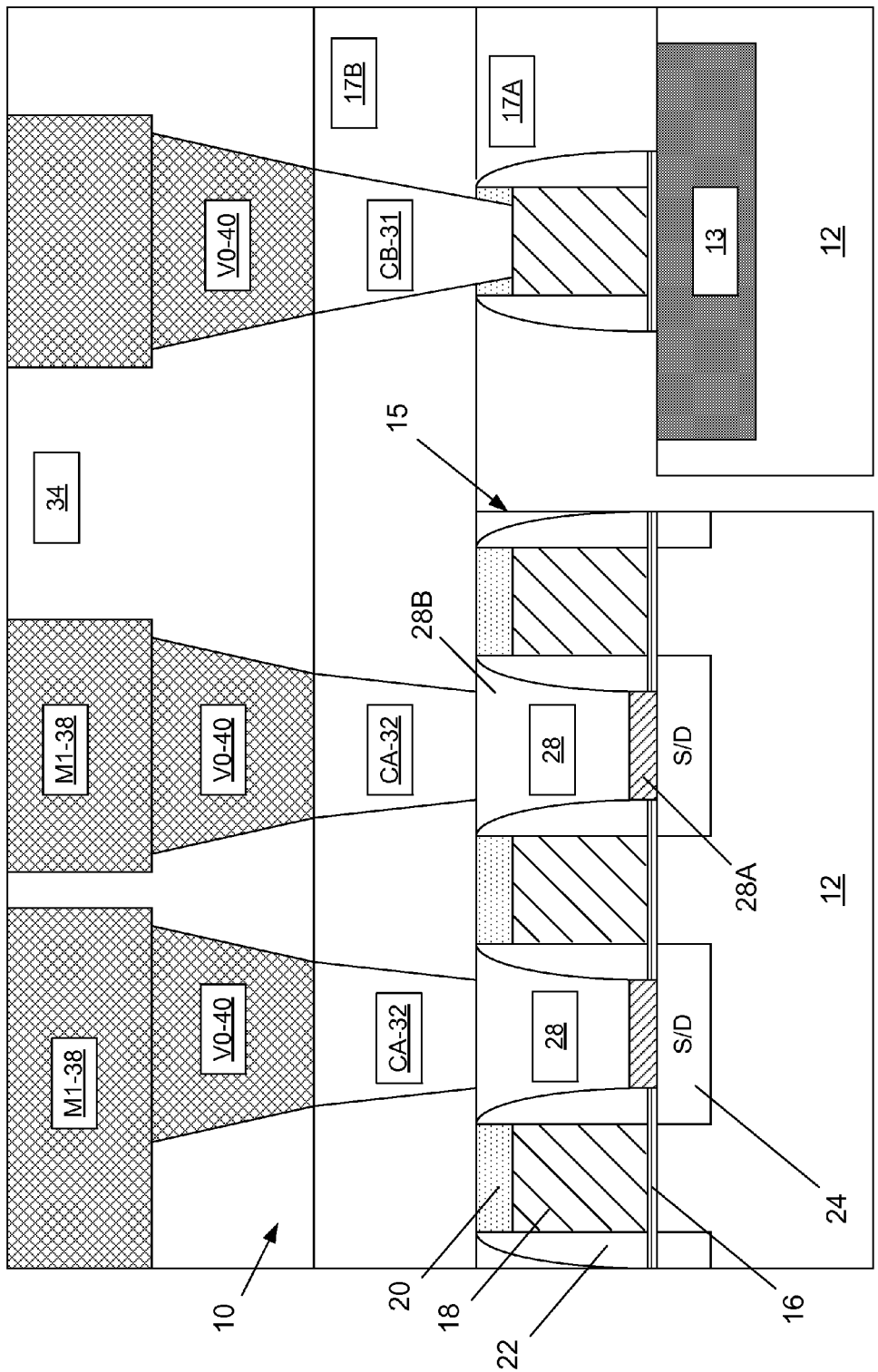

METHODS OF FORMING V0 STRUCTURES FOR SEMICONDUCTOR DEVICES THAT INCLUDES RECESSING A CONTACT STRUCTURE

BACKGROUND OF THE INVENTION

1. Field of the Invention

Generally, the present disclosure relates to the manufacture of sophisticated semiconductor devices, and, more specifically, to various methods of forming V0 structures for semiconductor devices that includes recessing a contact structure and various semiconductor devices having the resulting V0 structural configurations.

2. Description of the Related Art

In modern integrated circuits, such as microprocessors, storage devices and the like, a very large number of circuit elements, especially transistors, are provided and operated on a restricted chip area. Generally, in complex circuitry including complex logic portions, MOS technology is presently a preferred manufacturing technique in view of device performance and/or power consumption and/or cost efficiency. In integrated circuits fabricated using MOS technology, field effect transistors (FETs), such as planar field effect transistors and/or FinFET transistors, are provided that are typically operated in a switched mode, i.e., these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level where the actual semiconductor-based circuit elements, such as transistors, are formed in and above the semiconductor substrate.

Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques. Additional metallization layers are formed above the M1 layer, e.g., M2/V1, M3/V2, etc. Within the industry, conductive structures below the V0 level are generally considered to be "device-level" contacts or simply "contacts," as they contact the "device" (e.g., a transistor) that is formed in the silicon substrate.

FIG. 1A is a cross-sectional view of an illustrative integrated circuit product 10 comprised of a plurality of transistor devices 15 formed in and above a semiconductor substrate 12. A schematically depicted isolation region 13 has also been formed in the substrate 12. In the depicted example, the transistor devices 15 are comprised of an illustrative gate structure, i.e., a gate insulation layer 16 and a gate electrode 18, a gate cap layer 20, a sidewall spacer 22 and simplistically depicted source/drain regions 24. At the point of fabrication depicted in FIG. 1A, layers of insulating material 17A, 17B, i.e., interlayer dielectric materials, have been formed above the product 10. Other layers of material, such as contact etch stop layers and the like, are not depicted in the attached drawings. Also depicted are illustrative source/drain contact structures 28 which include a combination of a so-called "trench silicide" (TS) region 28A and a metal region 28B (such as tungsten). In the depicted process flow, the upper surface of the source/drain contact structures 28 is approximately planar with the upper surface of the gate cap layers 20. Also depicted in FIG. 1A are a plurality of so-called "CA contact" structures 32 and an illustrative gate contact structure 31 which is sometimes referred to as a "CB contact" structure. The CA contact structures 32 and the CB contact structure 31 are formed to provide electrical connection between the underlying devices and the V0 via level. The CA contact structures 31 are formed to provide electrical contact to the source/drain contact structures 28, while the CB contact 31 is formed so as to contact a portion of the gate electrode 18 of one of the transistors 15. In a plan view (not shown), the CB contact 31 is positioned vertically above the isolation region 13, i.e., the CB contact 31 is not positioned above the active region defined in the substrate 12. The CA contact structures 32 may be in the form of discrete contact elements, i.e., one or more individual contact plugs having a generally square-like or cylindrical shape, that are formed in an interlayer dielectric material, as shown in FIG. 1A. In other applications (not shown in FIG. 1A), the CA contact structures 32 may also be a line-type feature that contacts underlying line-type features, e.g., the source/drain contact structures 28 that contact the source/drain region 24 and typically extend across the entire active region on the source/drain region 24. Typically, the CB contact 31 is in the form of a round or square plug.

In one embodiment, the process flow of forming the source/drain contact structures 28, CA contacts 32 and CB contact 31 may be as follows. After a first layer of insulating material 17A is deposited, source/drain contact openings are formed in the first layer of insulating material 17A that expose portions of underlying source/drain regions 24. Thereafter, traditional silicide 28A is formed through the source/drain contact openings, followed by forming a metal 28B (such as tungsten) on the metal silicide regions 28A, and performing a chemical mechanical polishing (CMP) process down to the top of the gate cap layer 20. Then, a second layer of insulating material 17B is deposited. In older devices, the packing density was such that the openings in the layer of insulating material 17B for both the CA contact structures 32 and the CB contact structure 31 could be formed using a single patterned etch mask. However, as packing densities have increased with newer device generations, the openings in the layer of insulating material 17B for the CA contact structures 32 and the CB contact structure 31 are formed separately using two different masking layers—a CA masking layer and a CB masking layer. Thus, in one illustrative process flow, using the CA masking layer, the contact openings for the CA contacts 32 are formed first in the second layer of insulating material 17B so as to expose portions of the tungsten metallization 28B of the underlying source/drain contact structure 28. Then the CA masking layer is removed and the CB masking layer is formed over the second layer of insulating material 17B and in the previously formed CA contact openings formed therein. Next, using the CB masking layer, the opening for the CB contact 31 is formed in the second layer of insulating material 17B and through the gate cap layer 20 so as to expose a portion of the gate electrode 18. Thereafter, the CB masking layer is removed and the CA contacts 32 and the CB contact 31 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 32 and CB contact 31 typically contain a uniform body of metal, e.g., tungsten, and may also include one or more metallic barrier layers (not shown) positioned between the uniform body of metal and the layer of insulating material 17B. The source/drain contact structures 28, the CA contacts 32 and the CB contact 31 are all considered to be device-level contacts within the industry.

Also depicted in FIG. 1A is the first metallization layer—the so-called M1 layer—of the multi-level metallization system for the product 10 formed in a layer of insulating material 34, e.g., a low-k insulating material. A plurality of conductive vias—so-called V0 vias 40—are provided to establish electrical connection between the device-level contacts—CA contacts 32 and the CB contact 31—and the M1 layer. The M1 layer typically includes a plurality of metal lines 38 that are routed as needed across the product 10.

FIGS. 1B-1F depict a semiconductor device with self-aligned contacts where a line-type CA structure 30 (FIG. 1C) was formed using one illustrative prior art technique. In this illustrative example, the CA contact structure 30 is not formed in a separate layer of insulating material, as was the CA contact structures 32 (in the layer 17B) described above. Rather, in this process flow, the upper metal portion of the source/drain contact structure (positioned below the level of the gate cap layers 20) serves as the "CA contact structure." In this process flow, only the CB contact is formed above the gate cap layers 20 in a separate layer of insulating material. That is, using this process flow, the formation of a separate CA contact in a layer of insulating material positioned above the level of the gate cap layers 20 is omitted, and only a single masking layer—the CB masking layer—is used to form the equivalent of the CA contacts 32 and the gate contact 31 described above. However, relative to the process flow described in connection with FIG. 1A above, this process flow does require the formation of an extended-length V0 via to contact the CA contact structure 30, as described more fully below.

FIG. 1B depicts an illustrative prior art integrated circuit product 10 comprised of first and second transistors 15A, 15B formed in and above a semiconductor substrate 12. In the depicted example, each of the transistors 15A, 15B is comprised of the gate insulation layer 16 and the gate electrode 18, the gate cap layer 20 and a sidewall spacer 22. Typically, the gate cap layer 20 and the sidewall spacer 22 are made of a material such as silicon nitride and their purpose is to effectively encapsulate and protect the gate structure. The gate structure may be formed using either gate first or replacement gate techniques. In the case where the gate structure is formed using replacement gate techniques, the cap layer 20 is formed after a sacrificial gate structure (not shown) is removed and after a replacement gate structure (e.g., high-k insulation layer and one or more metal layers is formed in the position previously occupied by the removed sacrificial gate structure). With continuing reference to FIG. 1B, also depicted are illustrative raised source/drain regions 24 and a layer of insulating material 26 (e.g., silicon dioxide) that is formed above the product 10 and planarized.

FIGS. 1B-1F will only depict the formation of a source/drain contact structure between the gate structures 15A, 15B so as to facilitate explanation. Those skilled in the art will appreciate that, in practice, a corresponding source/drain contact structure will be formed for all of the source/drain regions, i.e., on the source/drain region to the left of the gate structure 15A and on the source/drain region to the right of the gate structure 15B.

Accordingly, FIG. 1C depicts the product 10 after several process operations were performed to form a so-called self-aligned contact that is conductively coupled to the raised source/drain region 24. First, a patterned etch mask (not shown) was formed above the product 10 so as to expose the area between the gate structures 15A-15B. Thereafter, at least the insulating material 26 was etched selectively relative to the sidewall spacers 22 and the gate cap layer 20 to thereby expose the raised source/drain region 24. Next, the patterned etch mask was removed and a trench silicide structure 28A was formed on the exposed source/drain region 24 by performing traditional silicide processing operations. Thereafter, a line-type CA contact structure 30 comprised of, for example, tungsten, was formed so as to be conductively coupled to the trench silicide structure 28A. In one embodiment, the line-type CA contact structure 30 may be formed of a material such as tungsten and it may extend across substantially the entire active region of the substrate 12, just like the trench silicide structure 28A. In one particular example, the line-type CA contact structure 30 may be formed by overfilling the area above the trench silicide structure 28A with tungsten and thereafter performing a CMP process.

FIG. 1D depicts the product 10 after several process operations were performed. First, a layer of material 32 having a substantially uniform thickness was formed above the product depicted in FIG. 1C. The substantially uniform thickness of the layer of material 32 may vary depending upon the particular application. In one example, the layer of material 32 may be a material such as N-block (SiCNH). Thereafter, a patterned layer of insulating material 34, such as a low-k material (k value less than 3.3), having an opening 34A formed therein, was formed above the layer of material 32. The product depicted in FIG. 1D is the result of initially blanket depositing the layer of insulating material 34 above the product 10, and thereafter patterning the layer of material 34 through a patterned etch mask (not shown) so as to form the patterned layer of insulating material 34, with the opening 34A, as depicted in FIG. 1D.

FIG. 1E depicts the product 10 after several process operations were performed. First, the layer of material 32 was patterned using a patterned etch mask (not shown) so as to define the opening 32A, as depicted in FIG. 1E. The opening 32A is for the conductive V0 via 40 that will be subsequently formed therein. Ideally, the opening 32A will be relatively large in the lateral width direction so that the resulting V0 via 40 will also be relatively large—a "fat" V0. A relatively larger V0 is desirable in that it reduces the electrical resistance of the V0 structure 40 and it makes it easier to actually contact the underlying CA contact 30, i.e., the chances of missing the CA contact 30 decrease if the V0 via is relatively wide. Then, the conductive lines 38 and conductive V0 vias 40 were formed in the openings 34A, 32A, respectively, by depositing one or more conductive materials, e.g., barrier layers and copper, and performing a polarization process to remove excess conductive materials positioned outside of the opening 34A. FIG. 1E depicts an idealized V0 structure 40 that results when the etch process that is performed to form the opening 32A in the material layer 32 is timed perfectly such that there is effectively no consumption of the underlying gate cap layers 20 exposed by the opening 32A. Note that, in this process flow, the V0 via must extend down to at least the level of the upper surface of the gate cap layer 20 so that electrical contact may be made to the CA contact 30.

FIG. 1F depicts a situation wherein the idealized V0 structure 40 depicted in FIG. 1D is not achieved. As noted above, the opening 32A in the material layer 32 is formed such that it is relatively wide so that the ultimate V0 via will also be relatively wide or "fat." As shown in FIG. 1F, the width of the opening 32A is such that it typically overlaps the gate cap layer 20 of one or both of the transistors, as indicated by the dimensioned arrows 35. Unfortunately, there is typically little etch selectivity between the material of the material layer 32, which is frequently N-block, and the material of the gate cap layers 20, which is typically silicon nitride. As a result, if the etch process that is performed to form the opening 32A in the material layer 32 is not timed perfectly, some or all of the underlying gate cap 20 may also be consumed, thereby exposing a portion of the gate electrode 18. As a result, when the V0 via 40 is formed, the V0 via 40 may actually contact the exposed gate structures 18, as indicated in the dashed lines 37. Such a situation results in an electrical short between at least the V0 structure 40 (and perhaps the CA contact 30) and the gate electrode 18. Such a situation can result in complete device failure.

The present disclosure is directed to various methods of forming V0 structures for semiconductor devices, and various semiconductor devices having the resulting V0 structural configurations, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming V0 structures for semiconductor devices that includes recessing a contact structure and various semiconductor devices having the resulting V0 structural configurations. One illustrative method disclosed herein includes, among other things, forming a source/drain contact structure between two spaced-apart transistor gate structures, recessing the source/drain contact structure to define a recessed source/drain contact having a recessed upper surface, wherein the recessing of the source/drain contact structure defines a source/drain contact etch cavity, and performing a conformal deposition process to deposit a conformal second layer of insulating material above a first layer of insulating material, in the source/drain contact etch cavity and on the recessed upper surface of the recessed source/drain contact. In this example the method also includes forming a third layer of insulating material above the conformal second layer of insulating material, forming an opening in the conformal second layer of insulating material so as to expose at least a portion of the recessed upper surface of the recessed source/drain contact, and forming a V0 via such that it is conductively coupled to the exposed portion of the recessed source/drain contact structure, the V0 via being at least partially positioned in the opening in the conformal second layer of insulating material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict a semiconductor device with self-aligned contacts where a line-type CA structure was formed using one illustrative prior art technique;

Figure 1B:
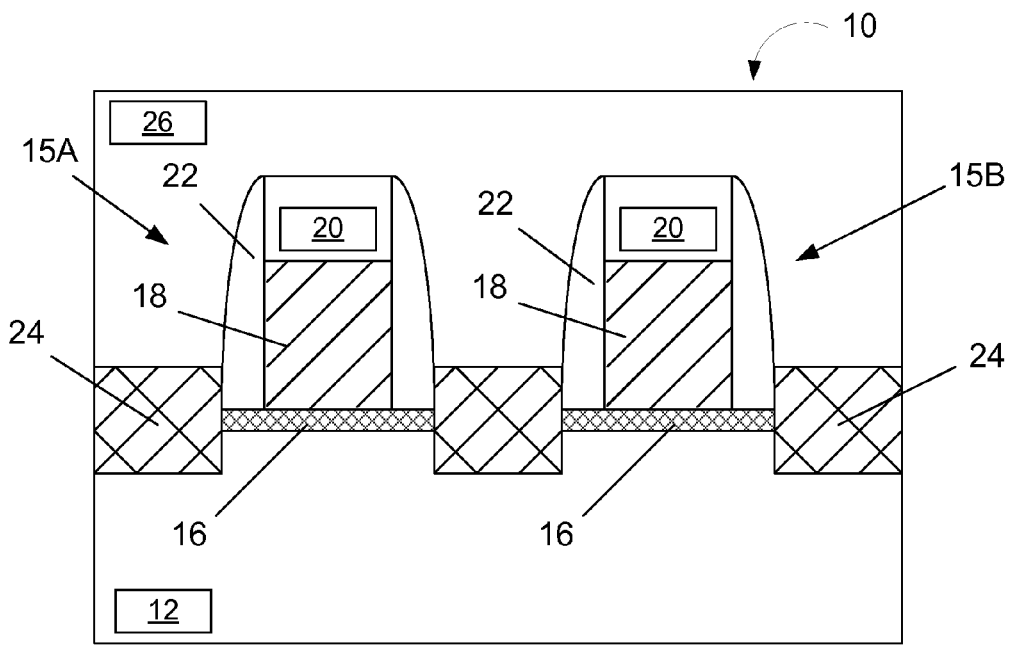

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming V0 structures for semiconductor devices that includes recessing a contact structure, and various semiconductor devices having the resulting V0 structural configurations. As will be readily apparent to those skilled in the art upon a complete reading of the present application, the methods disclosed herein may be employed with a variety of different technologies, e.g., NMOS, PMOS, CMOS, etc., and in manufacturing a variety of different integrated circuit products, including, but not limited to, logic products, memory products, etc. As will be appreciated by those skilled in the art after a complete reading of the present application, the methods disclosed herein may also be employed when manufacturing a variety of different type devices, e.g., planar devices, FinFET devices, nanowire devices, etc. Lastly, the gate structures for the illustrative transistor devices depicted herein may be formed using either "gate-first" or "replacement gate" manufacturing techniques. With reference to the attached figures, various illustrative embodiments of the methods and devices disclosed herein will now be described in more detail.

Figure 1C:
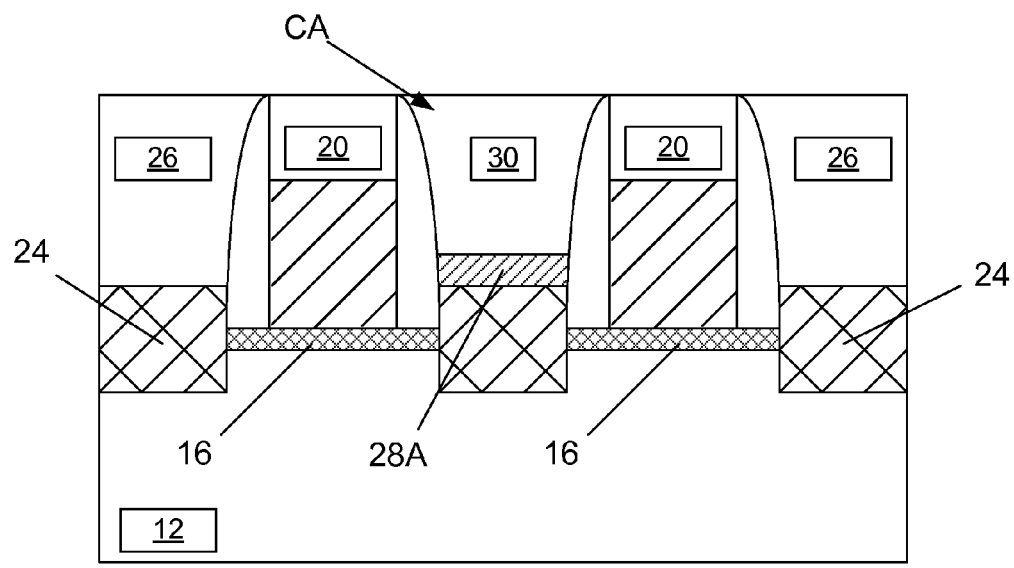
Figure 2A:
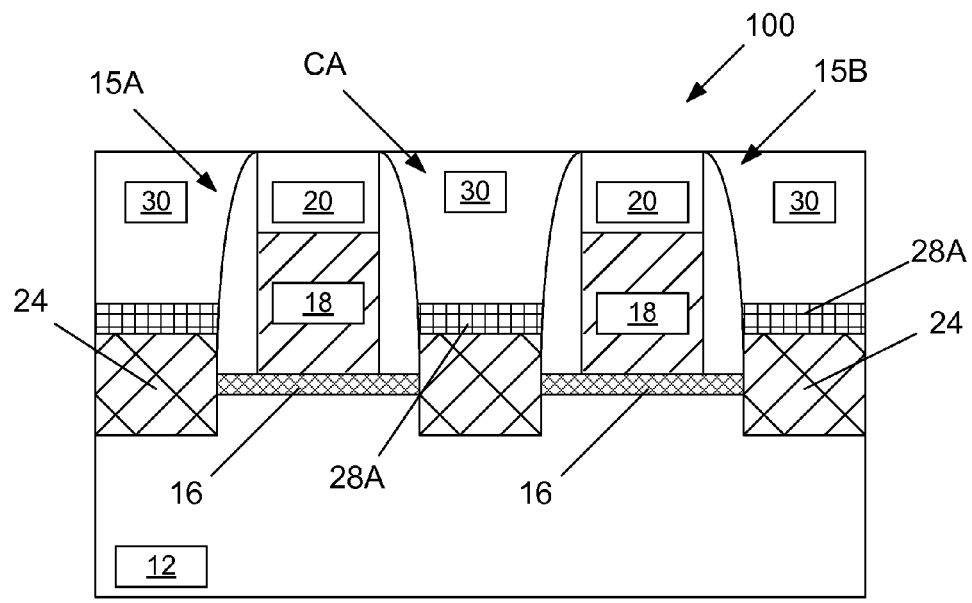
FIGS. 2A-2F depict various illustrative methods disclosed herein for forming V0 structures for semiconductor devices and devices that include the resulting V0 structural configurations.

FIGS. 2A-2F depict various illustrative methods disclosed herein for forming V0 structures. FIG. 2A is a simplified view of an illustrative semiconductor product 100 at an early stage of manufacturing that corresponds to that depicted in FIG. 1C above, i.e., after a line-type CA contact 30 was formed. That is, the CA contact 30 depicted in these drawings was formed without the use of a traditional CA masking layer. FIGS. 2A-2F will depict the formation of a source/drain contact structure (i.e., the TS structure 28A and the CA contact 30) above each of the source/drain regions 24. As depicted, the upper surfaces of the CA contact 30 are substantially planar with the upper surface of the gate cap layers 20.

Figure 2B:
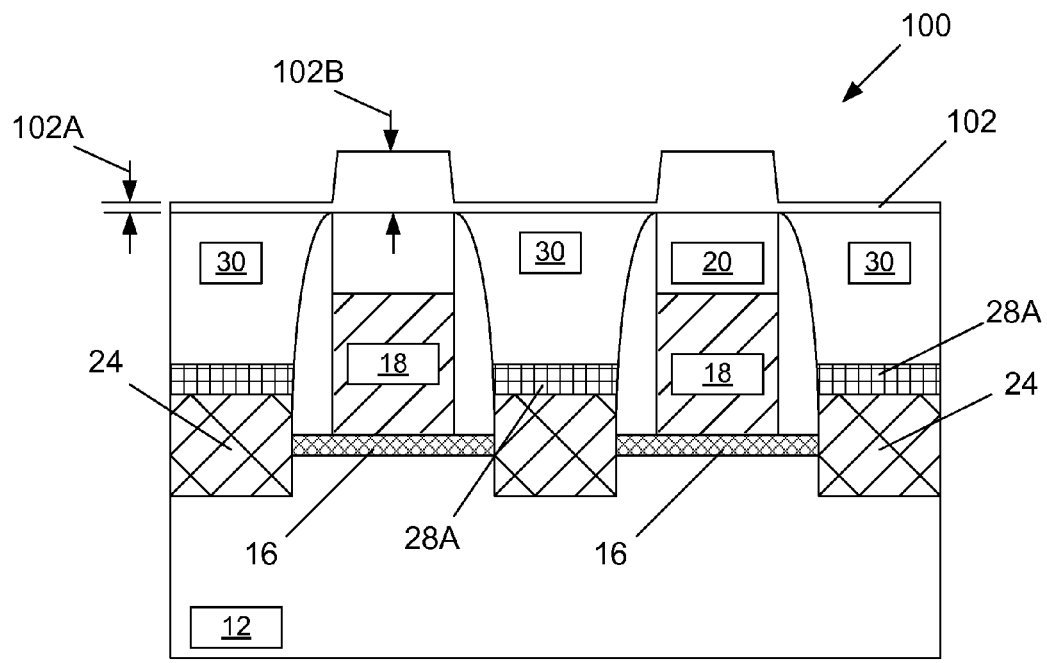

FIG. 2B depicts the product 100 after a layer of material 102 having a non-uniform thickness was formed on the product. More specifically, the non-uniform thickness layer of material 102 is formed such that its thickness 102B above the silicon nitride gate cap layers 20 is substantially thicker than its thickness 102A above the tungsten CA contact structures 30. In one illustrative embodiment, the non-uniform thickness layer of material 102 may be formed such that the thickness 102B is at least 10-30 nm greater than the thickness 102A. In absolute terms, the thickness 102A may fall within the range of about 5-25 nm, while the thickness 102B may fall within the range of about 15-55 nm. In one illustrative example, the non-uniform thickness layer of material 102 may be a layer of silicon nitride that is formed by the TELOS process (by LAM Research™) wherein the silicon nitride material selectively forms on the silicon nitride gate cap layer 20 at a much faster rate than it does on the tungsten CA contacts 30. In general, this process operation involves coating the upper metal surface of the tungsten CA contacts 30 with a self-assembled monolayer (SAM—not shown) so as to retard the growth of the layer of material 102 above the CA contacts 30. Generally, this SAM makes the metal surface hydrophobic. Accordingly, the layer of material 102 will grow at a faster rate above the silicon nitride gate cap layers 20 than it does above the upper metal surfaces of the metal CA contacts 30.

Figure 2C:
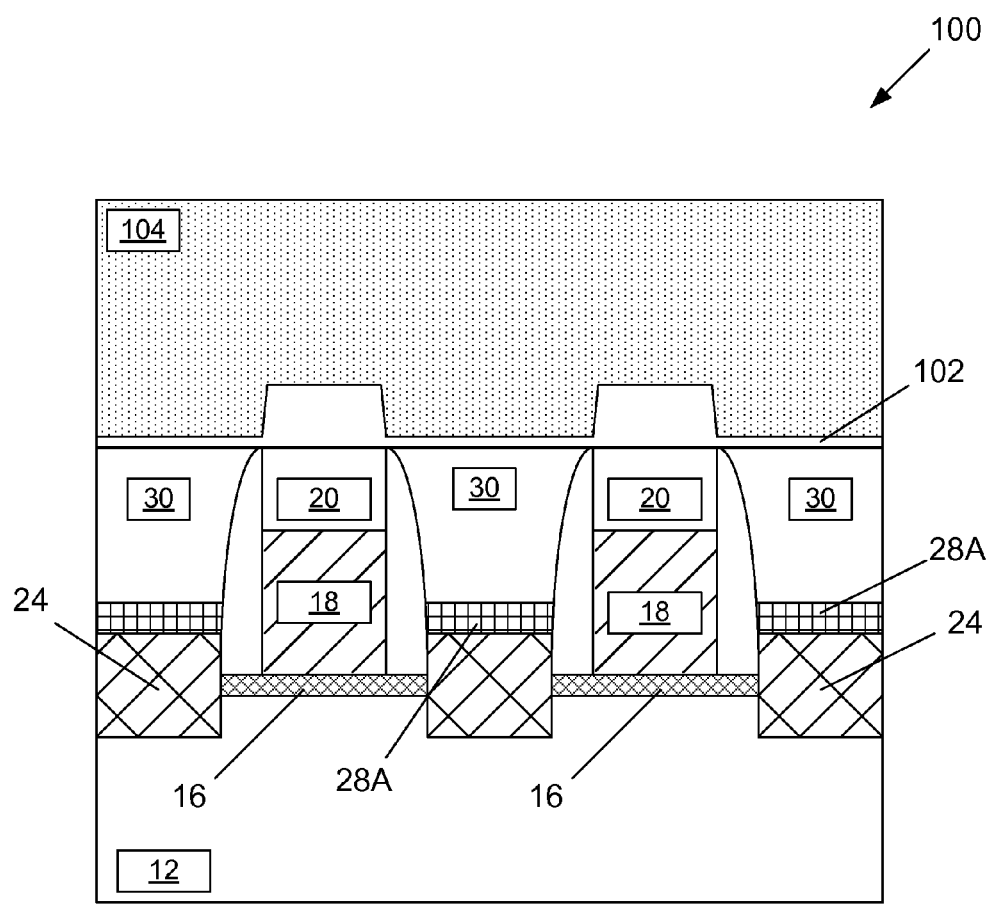

FIG. 2C depicts the product 100 a layer of insulating material 104, such as a low-k material (k value less than 3.3), was blanket deposited above the product 100.

Figure 2D:
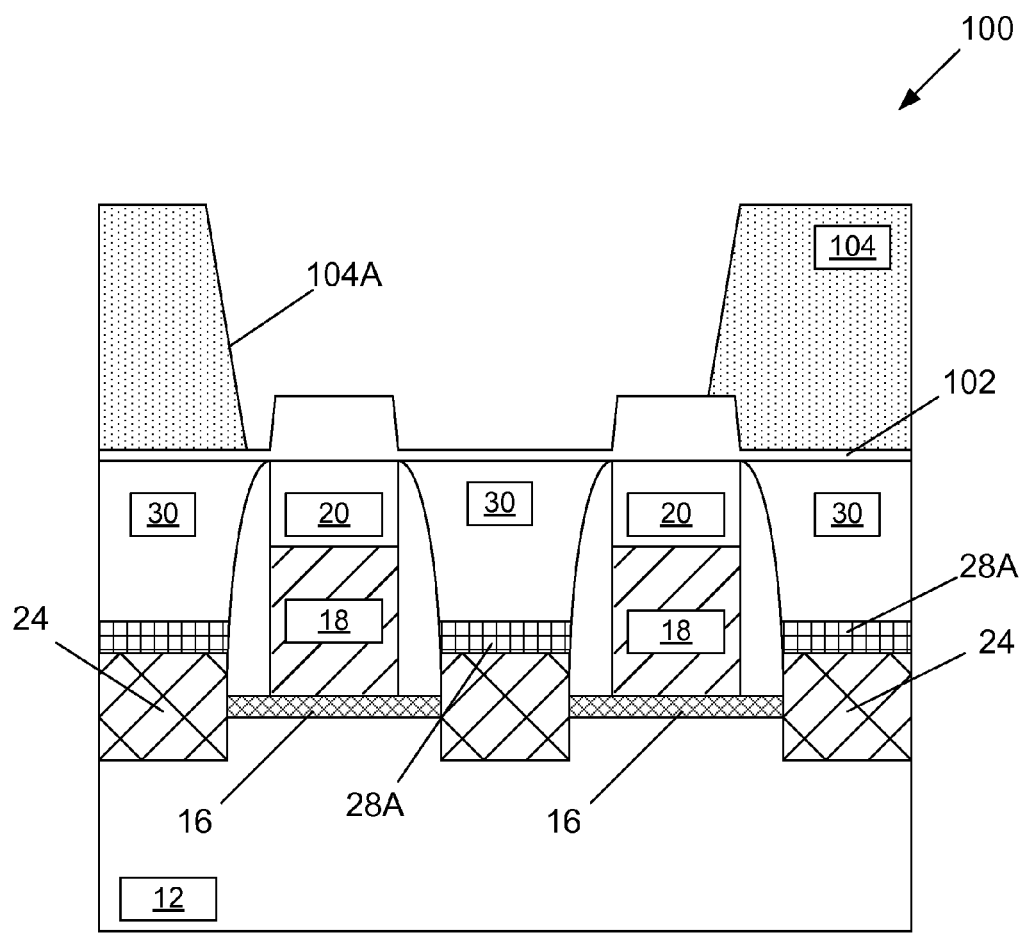

FIG. 2D depicts the product 100 after the layer of insulating material 104 was patterned using a patterned etch mask (not shown) so as to define an opening 104A in the layer of insulating material 104. The opening 104A exposes a portion of the non-uniform thickness layer of material 102 for further processing.

Figure 2E:
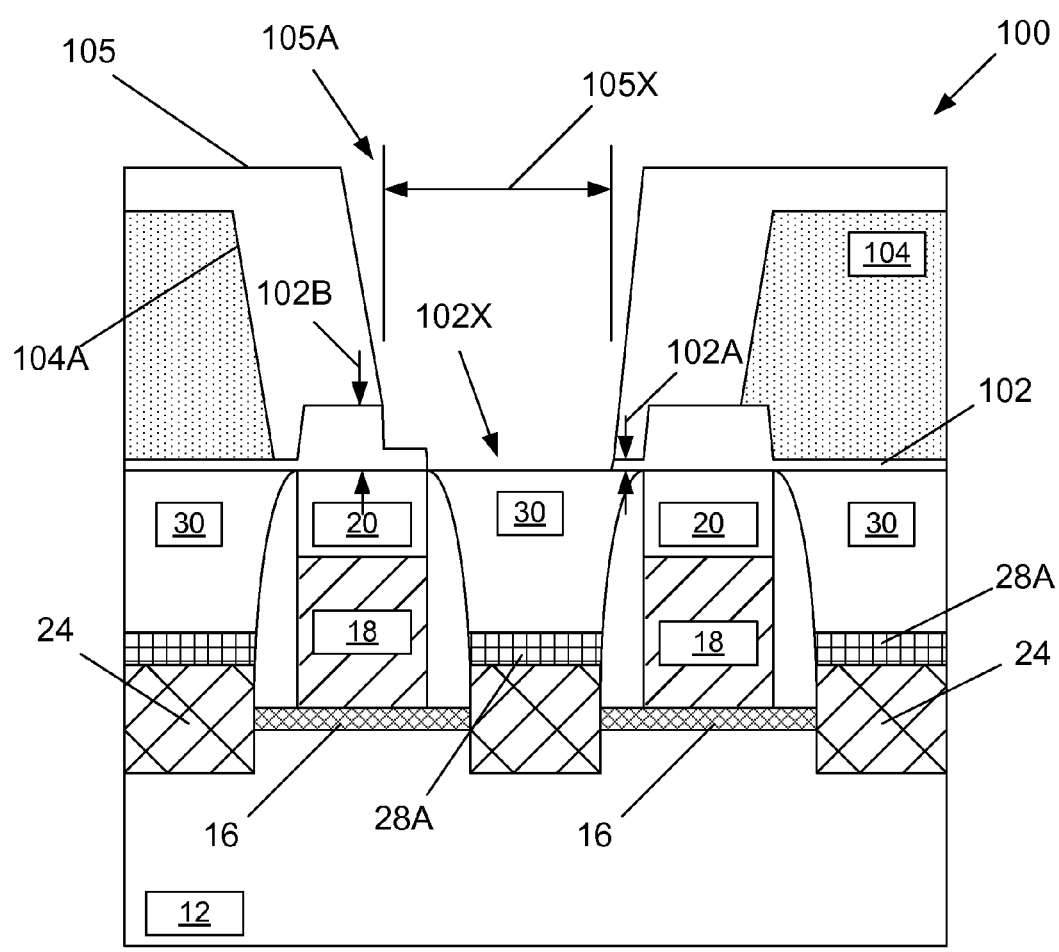

FIG. 2E depicts the product 100 after several process operations were performed. First, a patterned etch mask 105 (such as a patterned layer of photoresist) having an opening 105A was formed above the product 100. The opening 105A corresponds to an opening for a V0 via that will be formed in the non-uniform thickness layer of material 102 to establish electrical contact to the underlying CA contact 30. So as to facilitate explanation, only the formation of a V0 via for the middle CA contact 30 will be depicted in the following drawings. Of course, as will be appreciated by those skilled in the art, a similar V0 via will be formed for each of the CA contacts 30. Thereafter, an etching process was performed through the patterned etch mask 105 so as to define an opening 102X in the non-uniform thickness layer of material 102. The opening 102X exposes at least a portion of the underlying CA contact 30. Some recessing of the exposed portion of the CA contact 30 may occur during this etching process, but such recessing is not depicted in the attached drawings.

Figure 1D:
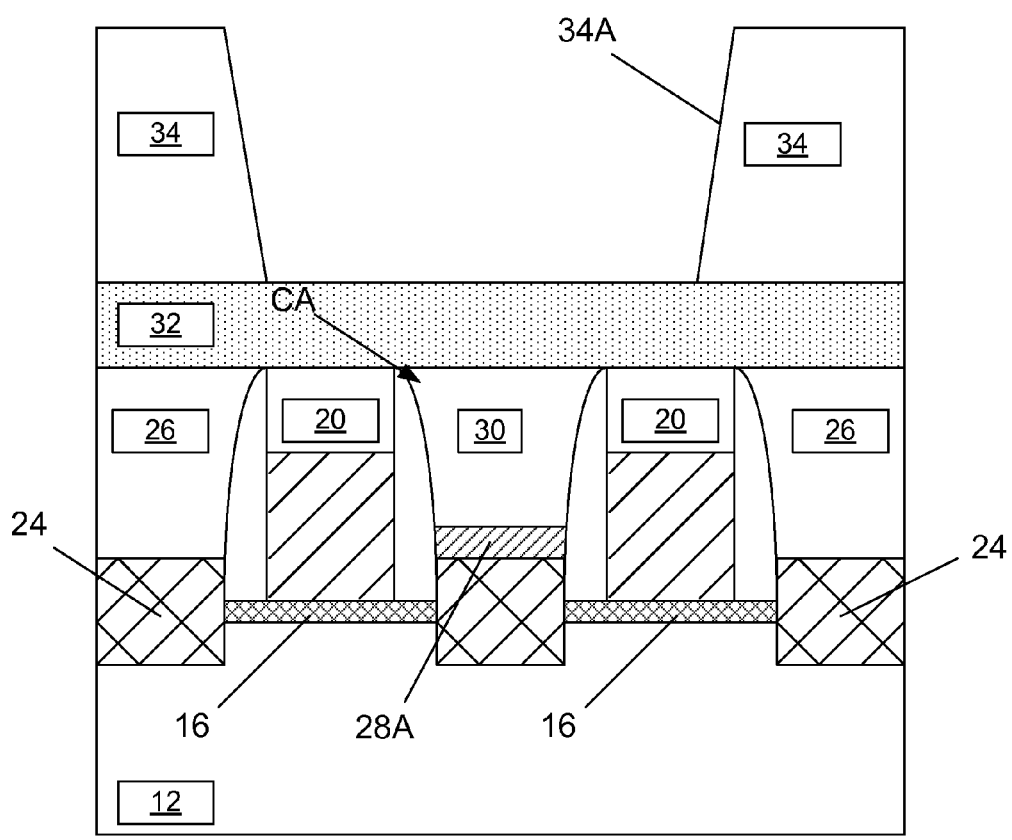
Figure 1E:
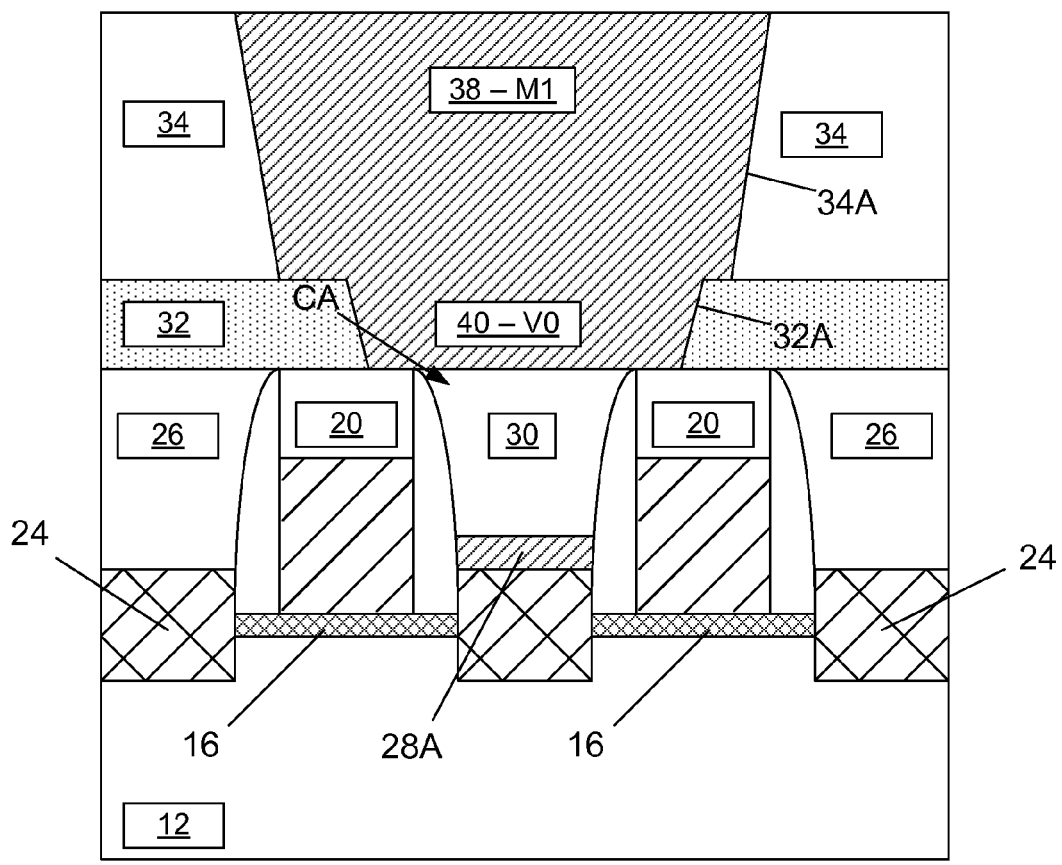
Figure 1F:
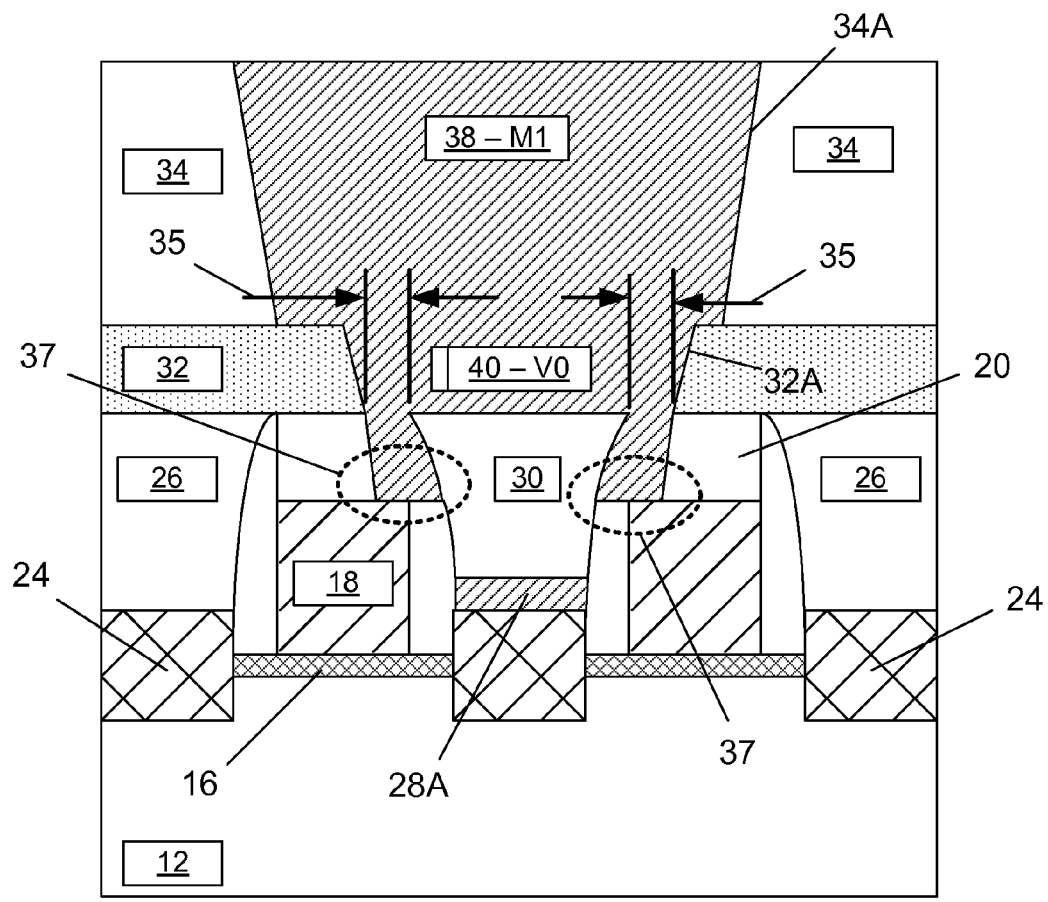

In the depicted example, the lateral width 105X of the opening 105A is such that it overlaps the gate electrode 18 of one of the transistors. More specifically, the opening 105A exposes both the thinner (102A) and thicker (102B) portions of the non-uniform thickness layer of material 102. Due to the presence of the thicker portions 102B of the non-uniform thickness layer of material 102 above the gate electrode, there is more material present to protect the gate electrode, e.g., the combined thickness of the gate cap layer 20 plus the thicker portion 102B of the non-uniform thickness layer of material 102. Additionally, the thicker material that is present above the gate electrode provides a greater process window when performing the etching process as the etching process does not have to be timed as accurately as when a uniform thickness layer of material (such as the layer 32 shown in FIG. 1D) was formed above the gate cap layers 20. Moreover, due to the presence of the thicker portions 102B of the non-uniform thickness layer of material 102, the lateral width 105X of the opening 105A, and the corresponding via opening 102X, may be made larger, thereby resulting in a larger V0 structure, which is desirable.

Figure 2F:
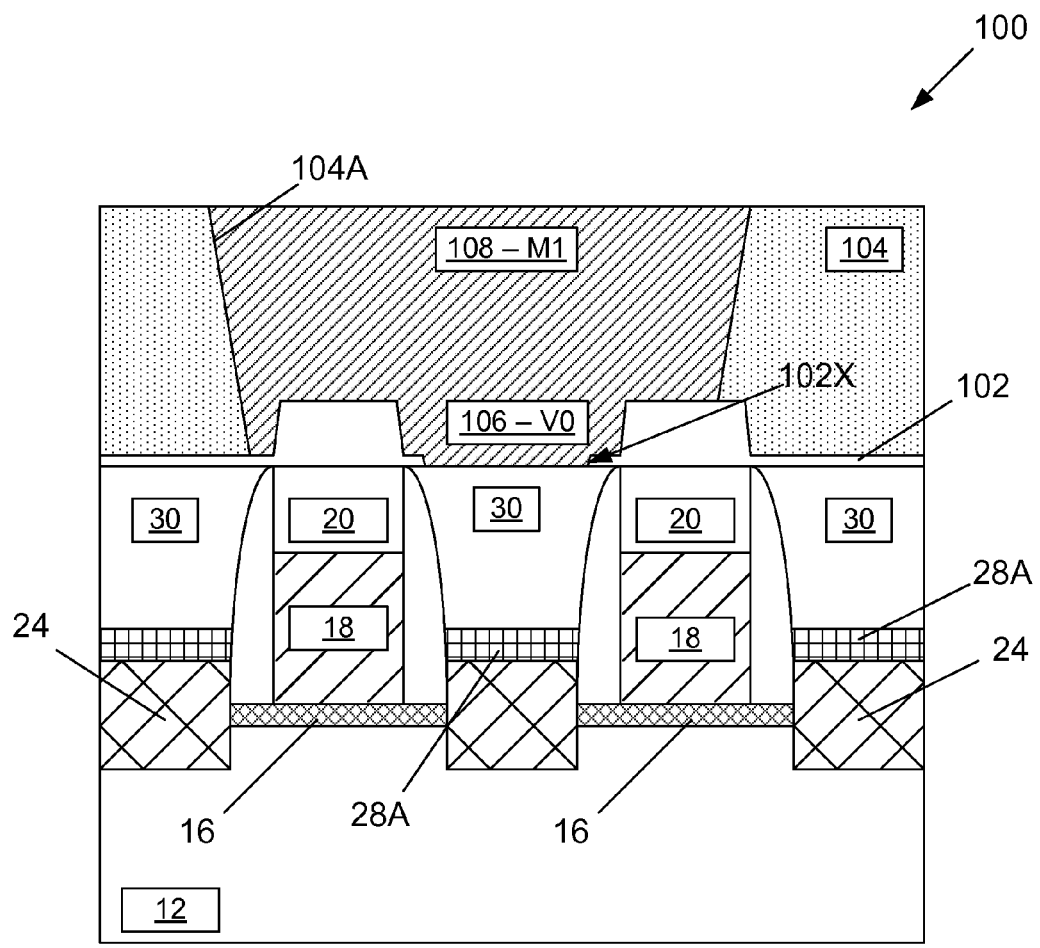

Next, as shown in FIG. 2F, after the patterned etch mask 105 was removed, known process operations were performed to form a conductive V0 via 106 and a conductive metal line 108 in the M1 metallization layer. These conductive structures may be comprised of a variety of different materials, e.g., copper, and may also include one or more barrier layers (not shown). In general, conductive materials may be formed in the openings 102X and 104A, and one or more CMP processes may be performed to planarize the upper surface of the layer 104 and to remove excess conductive material positioned outside of the opening 104A. At the point of fabrication depicted in FIG. 2F, additional metallization layers (not shown) may be formed above the M1 layer, e.g., M2/V1, M3/V2, etc.

Figure 3A:
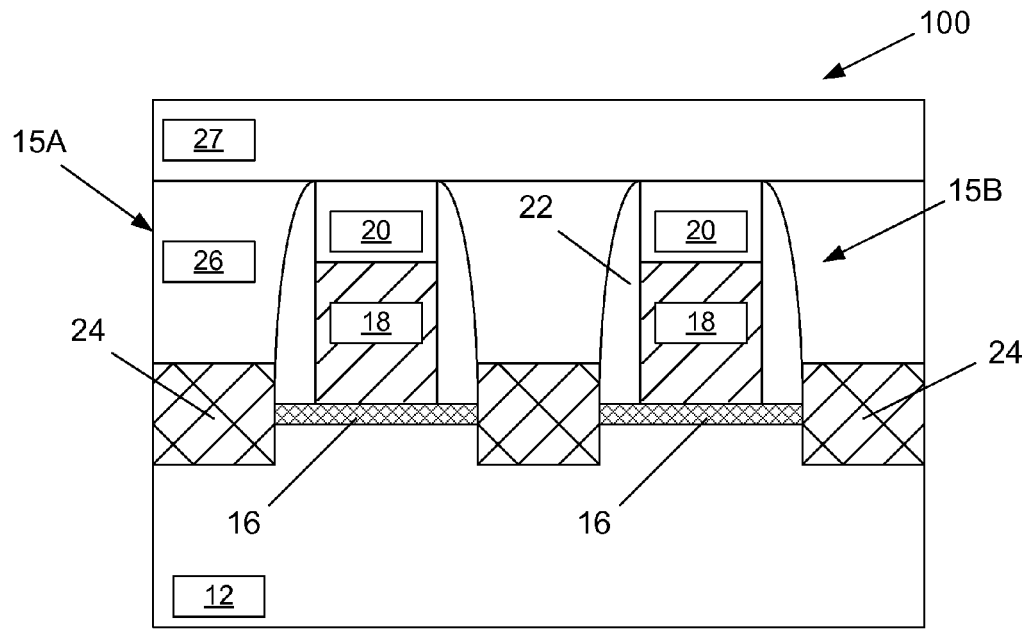
FIGS. 3A-3J depict other illustrative methods disclosed herein for forming V0 structures for semiconductor devices that includes recessing a contact structure and devices that include the resulting V0 structural configurations.

FIGS. 3A-3J depict other illustrative methods disclosed herein for forming V0 structures for semiconductor devices and devices that include the resulting V0 structural configurations. In this illustrative process flow, the CA contact 30 will be formed using a CA masking layer (not shown). FIGS. 3A-3J will depict the formation of a source/drain contact structure above only the middle source/drain region 24 so as to facilitate explanation of the present subject matter. Of course, those skilled in the art will appreciate that, in practice, a corresponding source/drain contact structure will be formed for all of the source/drain regions, i.e., on the source/drain region to the left of the gate structure 15A and on the source/drain region to the right of the gate structure 15B. FIG. 3A is a simplified view of an illustrative semiconductor product 100 at an early stage of manufacturing after the source/drain regions 24 and the gate structures were formed and after a planarization process was performed on a layer of insulating material 26, e.g., silicon dioxide. Thereafter, another layer of insulating material 27, e.g., silicon nitride or silicon dioxide, was formed above the gate cap layers 20 and the layer of insulating material 26. In this example, the gate structures may replacement gate structures wherein the cap layers 20 were formed after the materials for the replacement gate structure were formed in the space (gate cavity) between the sidewall spacers 22 and recessed.

Figure 3B:
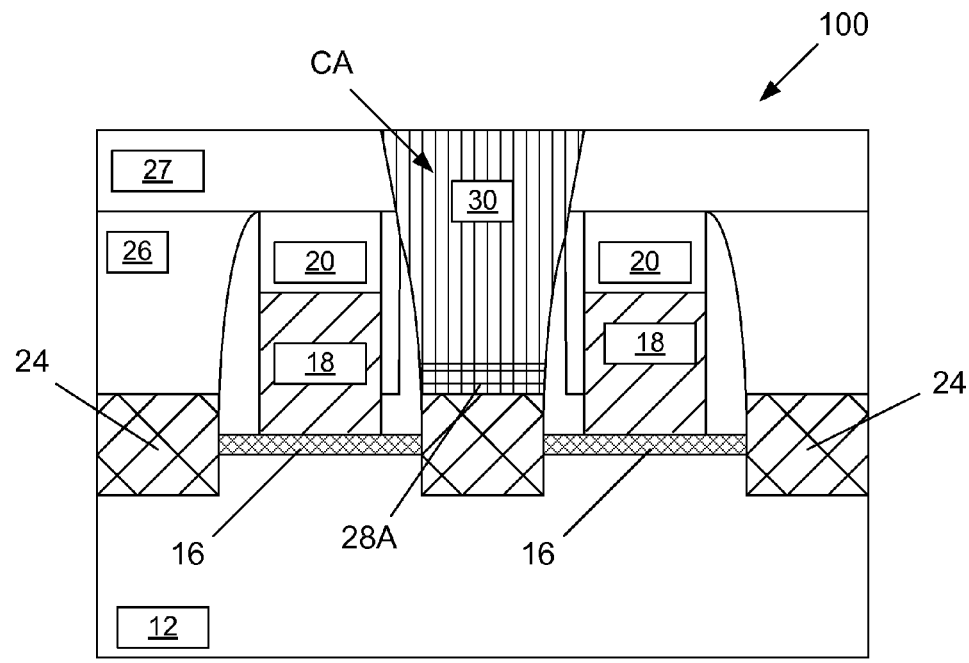

FIG. 3B depicts the product 100 after several process operations were performed to form a so-called self-aligned contact that is conductively coupled to the middle raised source/drain region 24. First, a patterned etch mask (a CA etch mask—not shown) was formed above the product 10 so as to expose the area between the gate structures 15A-15B. Thereafter, one or more etching processes were performed through the patterned CA etch mask to selectively remove portions of at least the layers of insulating material 26, 27 relative to the sidewall spacers 22 and the gate cap layer 20. This process operation exposes the raised source/drain region 24. Next, the patterned CA etch mask was removed and the above-described trench silicide (TS) structure 28A was formed on the exposed source/drain region 24 by performing traditional silicide processing operations. Thereafter, a line-type CA contact structure 30 comprised of, for example, tungsten, was formed so as to be conductively coupled to the trench silicide structure 28A. In one particular example, the line-type CA contact structure 30 may be formed by overfilling the area above the trench silicide structure 28A with tungsten and thereafter performing a CMP process to planarize the upper surface of the layer 27 and thereby remove any excess conductive materials.

Figure 3C:
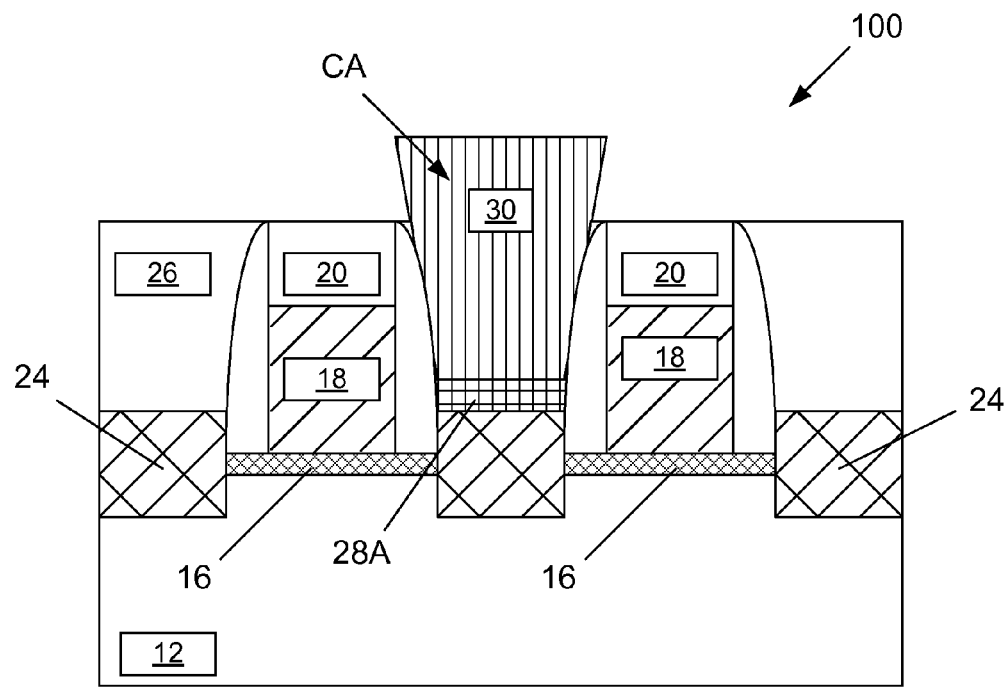

FIG. 3C depicts the product 100 after a recess etching process is performed to remove at least some of the layer 27, and, in the depicted example, substantially all of the layer 27 relative to the surrounding materials. This recess etching process exposes an upper portion of the CA contact structure 30.

Figure 3D:
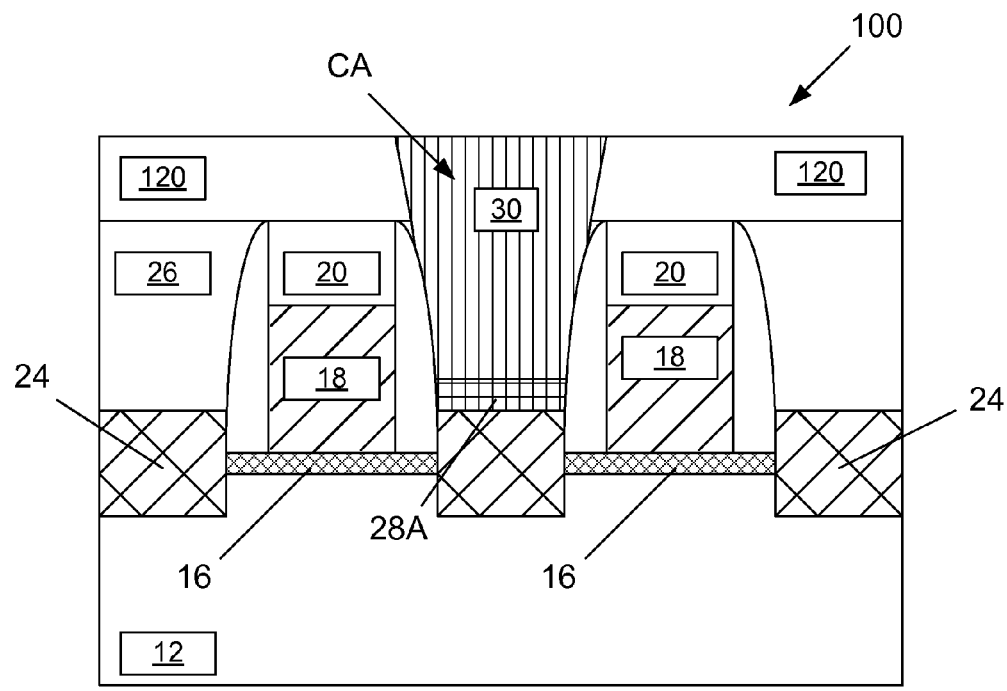

Then, as shown in FIG. 3D, a layer of insulating material 120 was formed on the product 100 and a CMP process was performed. The layer of insulating material 120 may be comprised of a variety of different materials, e.g., silicon nitride, etc., and it may be formed using traditional techniques, e.g., chemical vapor deposition (CVD), etc. At this point, the layer of insulating material 120 may have a thickness that falls within the range of about 15-30 nm. At the point depicted in FIG. 3D, the upper surface of the layer of insulating material 120 is at or near the same level as the upper surface of the CA contact structure 30.

Figure 3E:
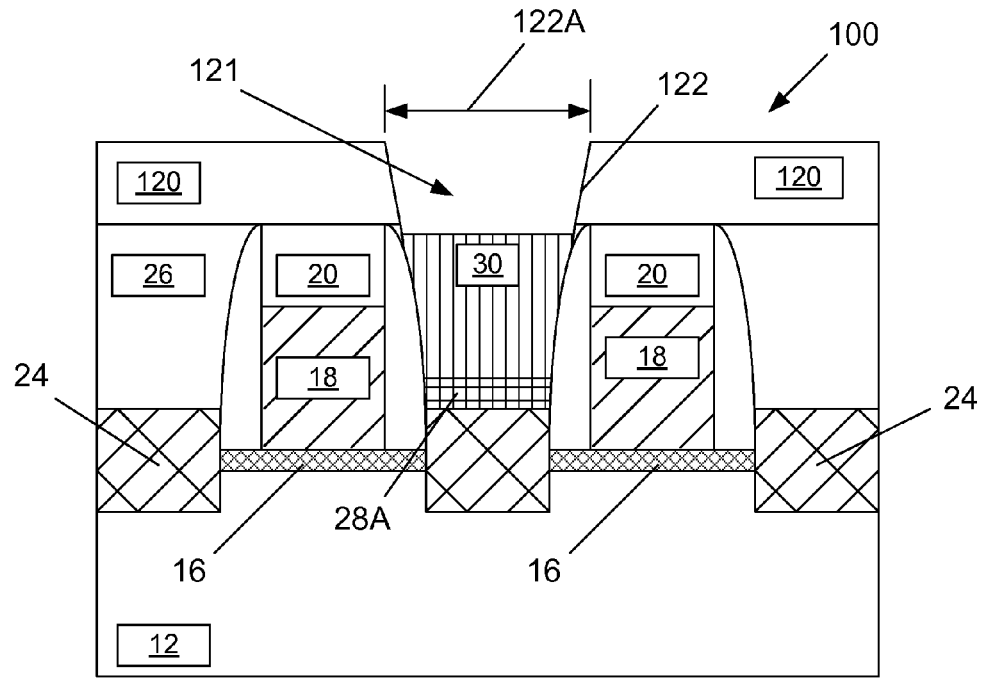

Next, as shown in FIG. 3E, a contact recess etching process is performed to reduce the height or thickness of the CA contact structure 30. This recessing operation results in the formation of a CA contact etch cavity 121 above the recessed CA contact structure 30. This recess etching process also results in the formation of an opening 122 in the layer of insulating material 120. At this point in fabrication, the opening 122 has a lateral width 122A.

Figure 3F:
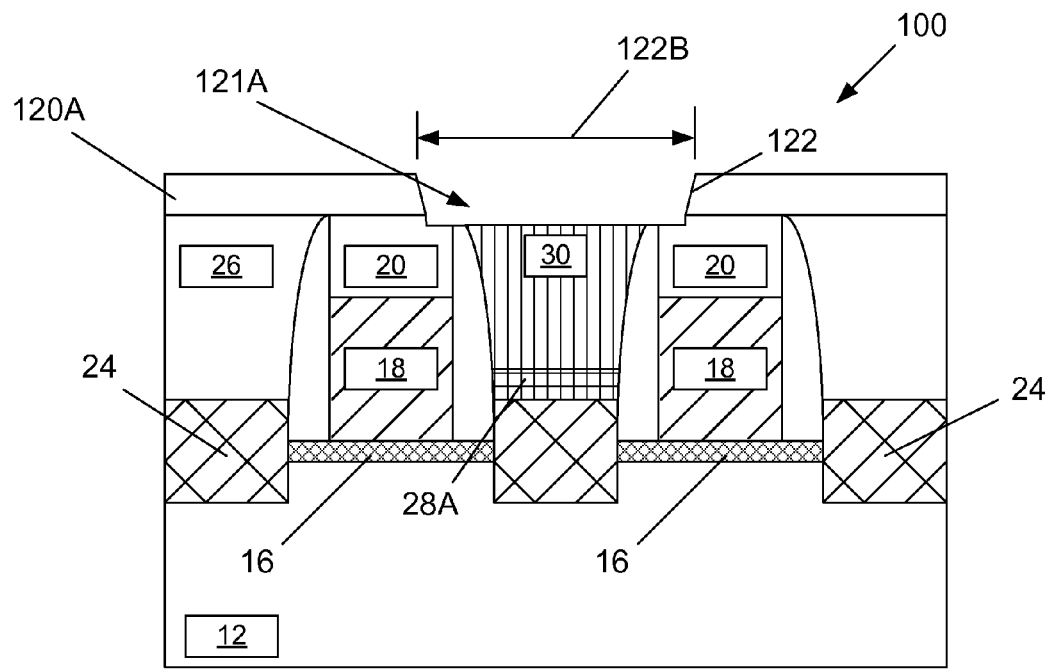

FIG. 3F depicts the product after a timed isotropic etching process was performed on the layer of insulating material 120. This etching process has the effect of increasing the lateral width of the opening 122 to a larger dimension 122B and also results in a thinning of the layer of insulating material 120, which has now been re-labeled with the number 120A to reflect its reduced thickness. In one illustrative embodiment, the reduced thickness layer of material 120A may have a thickness of about 6-15 nm. This process operation also has the effect of increasing the lateral width of the CA contact etch cavity 121, which has now been re-labeled with the number 121A to reflect its increased lateral width.

Figure 3G:
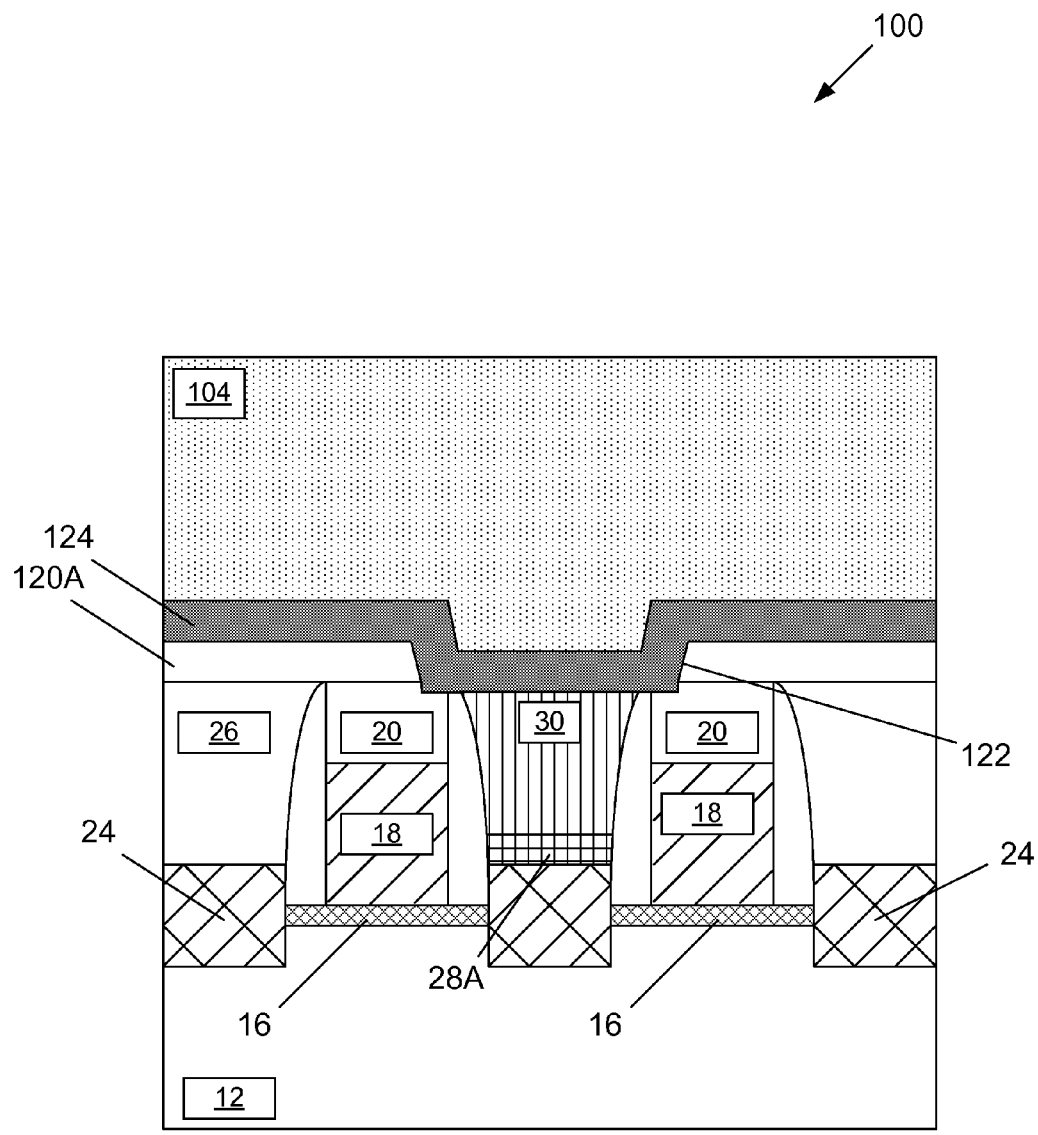

FIG. 3G depicts the product 100 after several process operations were performed. First, a conformably deposited layer of insulating material 124 is formed on the product 100. In one illustrative embodiment, the layer of insulating material 124 may have a thickness of about 5-20 nm, and it may be formed by performing a conformal CVD process. The layer of insulating material 124 may only partially fill the CA contact etch cavity 121A. The layer of insulating material 124 may be comprised of a variety of different insulating materials, e.g., silicon nitride, N-Block, silicon oxynitride, silicon carbon boron nitride, etc. Next, the above-described layer of insulating material 104 was blanket deposited above the product 100.

Figure 3H:
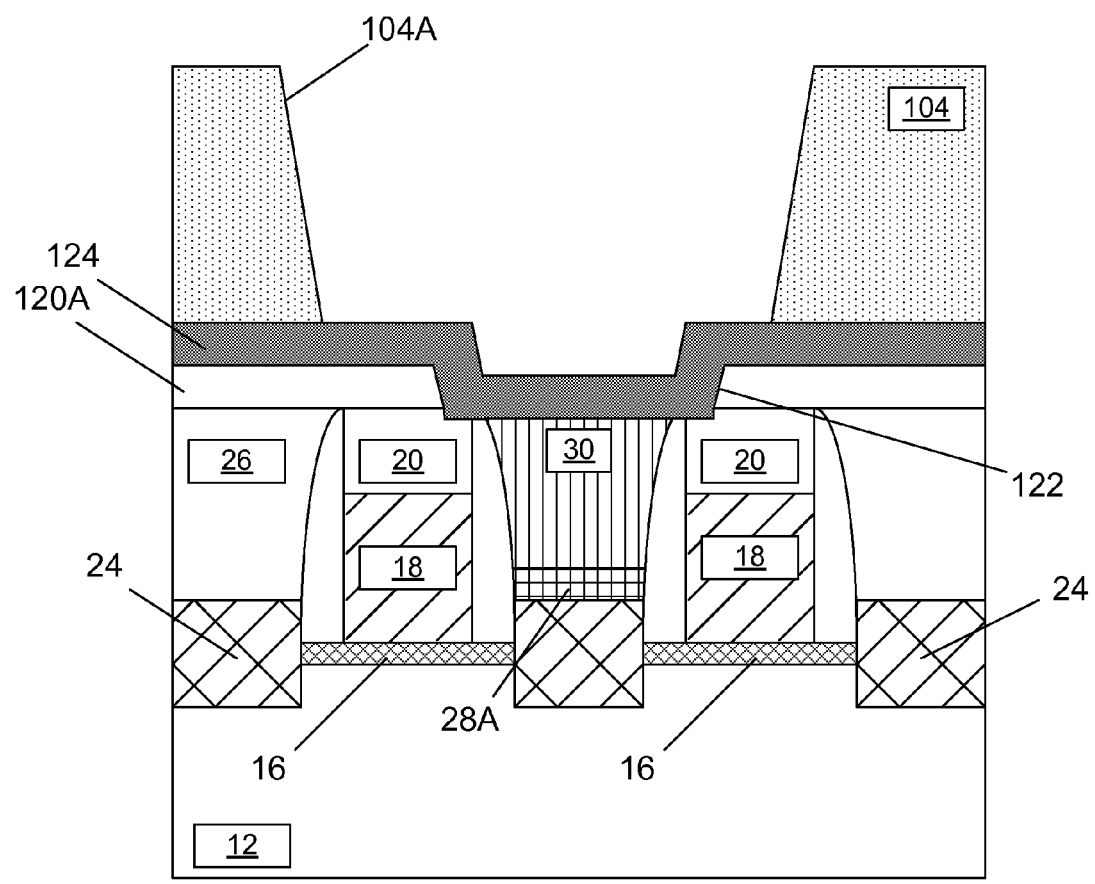

FIG. 3H depicts the product 100 after the layer of insulating material 104 was patterned using a patterned etch mask (not shown) so as to define the opening 104A in the layer of insulating material 104. The opening 104A exposes a portion of the layer of insulating material 124 for further processing.

Figure 3I:
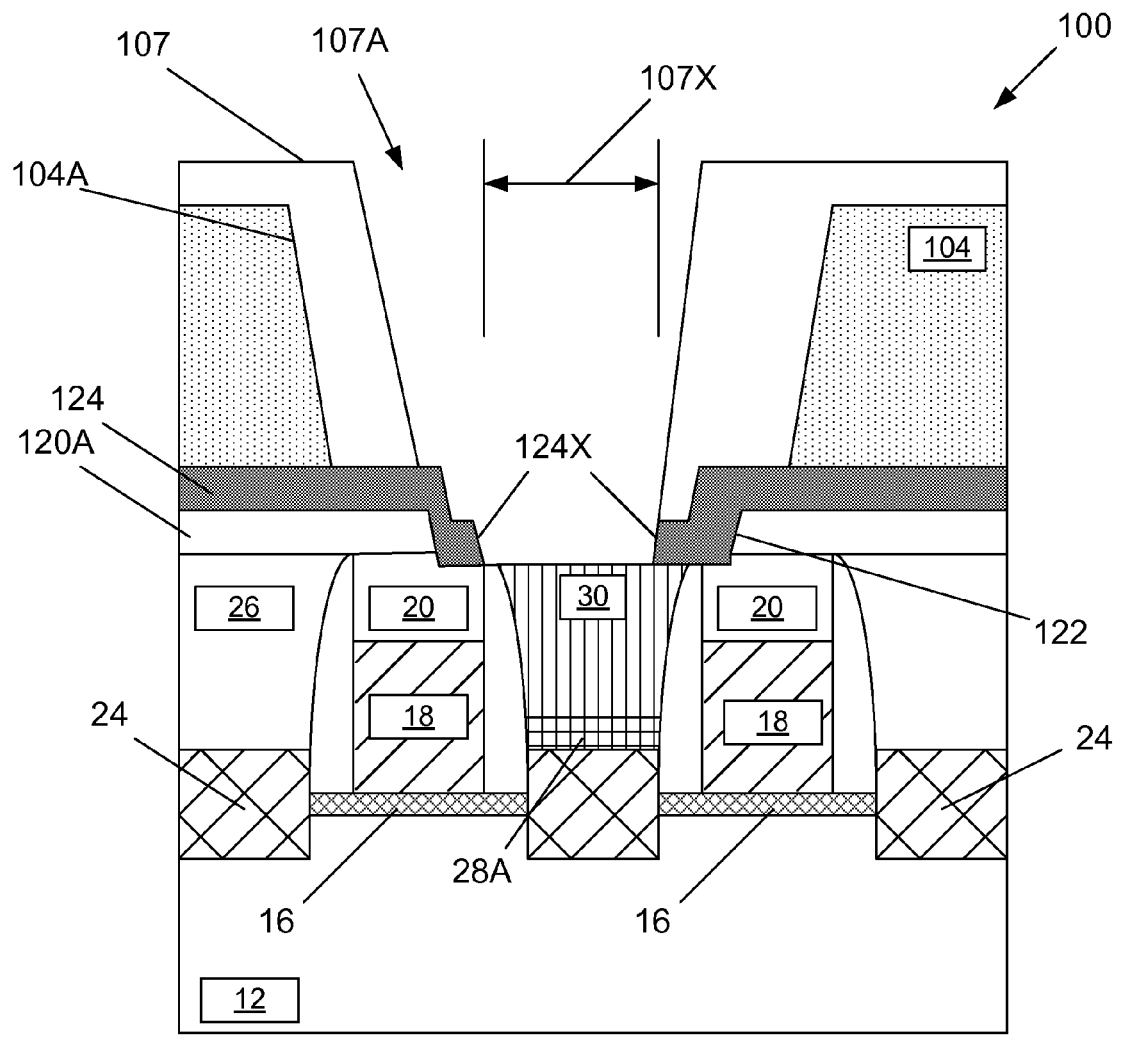

FIG. 3I depicts the product 100 after several process operations were performed. First, a patterned etch mask 107 (such as a patterned layer of photoresist) having an opening 107A was formed above the product 100. The opening 107A corresponds to an opening for a V0 via that will be formed in the layer of insulating material 124 to establish electrical contact to the underlying CA contact 30. So as to facilitate explanation, only the formation of a V0 via for the middle CA contact 30 will be depicted in the following drawings. Of course, as will be appreciated by those skilled in the art, a similar V0 via will be formed for each of the CA contacts 30. Thereafter, an etching process was performed through the patterned etch mask 107 so as to define an opening 124X in the layer of insulating material 124. The opening 124X exposes at least a portion of the underlying CA contact 30 (that was exposed prior to the formation of the layer of insulating material 124 (see FIG. 3E)).

In the depicted example, the lateral width 107X of the opening 107A is such that it overlaps the gate electrode 18 of one of the transistors on the left. However, due to the presence of the reduced thickness layer of material 120A being positioned vertically above the gate electrode, there is more material present to protect the gate electrode, e.g., the combined thickness of the gate cap layer 20 plus the thickness of the reduced thickness layer of material 120A. Additionally, by recessing the CA contact structure 30 (and thereby forming the CA contact etch cavity 121 (or 121A) and the opening 122 in the layer of insulating material 120/120A) prior to forming the layer of insulating material 124, there is less protective material above the CA contact structure 30 than there is above the gate electrode. This provides a greater process window when performing the etching process on the layer of insulating material 124 as the etching process does not have to be timed as accurately as when a uniform thickness layer of material (such as the layer 32 shown in FIG. 1D) was formed above the gate cap layers 20 and the CA contact structure 30. Moreover, due to the presence of the thicker portions of material above the gate electrodes, the lateral width 107X of the opening 107A, and the corresponding via opening 124X, may be made larger, thereby resulting in a larger V0 structure.

Figure 3J:
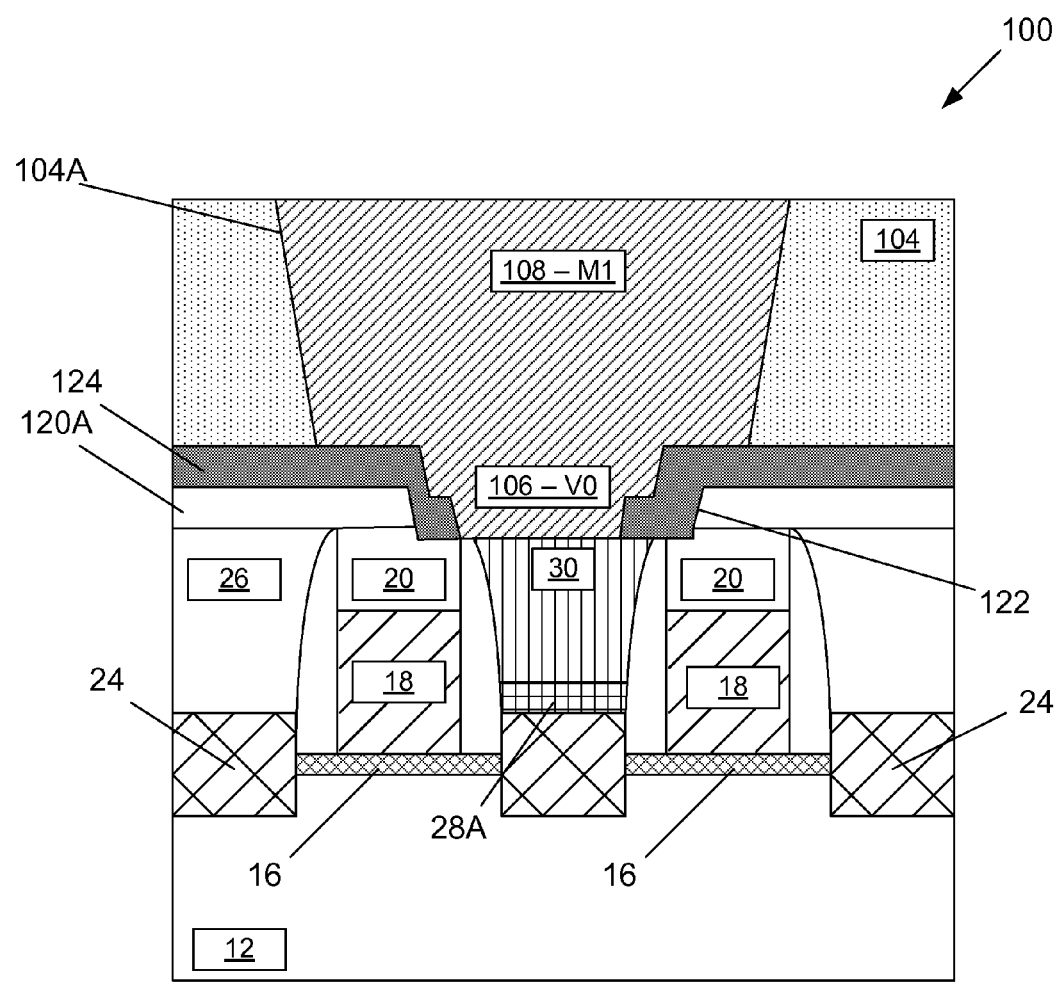

Next, as shown in FIG. 3J, after the patterned etch mask 107 was removed, known process operations were performed to form the above-described conductive V0 via 106 and a conductive metal line 108 in the M1 metallization layer. At the point of fabrication depicted in FIG. 3J, additional metallization layers (not shown) may be formed above the M1 layer, e.g., M2/V1, M3/V2, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a via on an integrated circuit product comprised of two spaced-apart transistor gate structures, each of said gate structures having a gate cap layer with an upper surface, the method comprising:
    forming a source/drain contact structure between said two spaced-apart transistor gate structures, wherein an upper surface of said source/drain contact structure is positioned at a first level that is above a level of said upper surfaces of said gate cap layers;
    recessing said source/drain contact structure to define a recessed source/drain contact having a recessed upper surface that is positioned at a second level that is lower than said first level, wherein said recessing of said source/drain contact structure defines a source/drain contact etch cavity that is defined, at least in part, by said recessed upper surface of said recessed source/drain contact and a first layer of insulating material;
    performing a conformal deposition process to deposit a conformal second layer of insulating material above said first layer of insulating material, in said source/drain contact etch cavity and on said recessed upper surface of said recessed source/drain contact;
    forming a third layer of insulating material above said conformal second layer of insulating material;
    performing at least one etching process to form an opening in said conformal second layer of insulating material so as to expose at least a portion of said recessed upper surface of said recessed source/drain contact; and
    forming said via such that it is conductively coupled to said exposed portion of said recessed source/drain contact structure, said via being at least partially positioned in said opening in said conformal second layer of insulating material.

2. The method of claim 1, further comprising, after forming said source/drain contact structure and prior to recessing said source/drain contact structure, removing insulating material positioned adjacent an upper portion of said source/drain contact structure and forming said first layer of insulating material adjacent said upper portion of said source/drain contact structure.

3. The method of claim 1, wherein said two gate structures are each a replacement gate structure comprised of a gate insulation layer comprised of a high-k insulating material and a gate electrode comprised of at least one layer of metal.

4. The method of claim 1, wherein, after forming said third layer of insulating material and prior to performing said at least one etching process, the method further comprises forming an opening in said third layer of insulating material so as to expose a portion of said conformal second layer of insulating material.

5. The method of claim 1, wherein forming said via comprises forming said via such that a portion of said via is positioned vertically above said gate cap layer of at least one of said two gate structures and above a portion of said conformal second layer of insulating material having said opening formed therein.

6. The method of claim 1, wherein said first layer of insulating material is comprised of one of silicon dioxide or silicon nitride.

7. The method of claim 1, wherein said conformal second layer of insulating material is comprised of one of silicon dioxide or silicon nitride.

8. The method of claim 1, wherein said third layer of insulating material is comprised of a low-k insulating material.

9. The method of claim 1, wherein, prior to performing said conformal deposition process, the method comprises performing an isotropic etching process to increase a lateral width of said source/drain contact etch cavity and reduce a thickness of said first layer of insulating material.

10. A method of forming a via on an integrated circuit product comprised of two spaced-apart transistor gate structures, each of said gate structures having a gate cap layer with an upper surface, the method comprising:
    forming a line-type trench silicide contact that is conductively coupled to a source/drain region positioned between said two gate structures;
    forming a line-type source/drain contact structure (line-type CA contact structure) comprised of tungsten on said line-type trench silicide contact, wherein an upper surface of said line-type source/drain contact structure is positioned at a first level that is above a level of said upper surfaces of said gate cap layers;
    recessing said line-type source/drain contact structure to define a recessed line-type source/drain contact structure having a recessed upper surface that is positioned at a second level that is lower than said first level, wherein said recessing of said line-type source/drain contact structure defines a source/drain contact etch cavity that is defined, at least in part, by said recessed upper surface of said recessed line-type source/drain contact structure and a first layer of insulating material;
    performing an isotropic etching process to increase a lateral width of said source/drain contact etch cavity and reduce a thickness of said first layer of insulating material;
    performing a conformal deposition process to deposit a conformal second layer of insulating material above said first layer of insulating material, in said source/drain contact etch cavity with said increased lateral width and on said recessed upper surface of said recessed line-type source/drain contact structure;
    forming a third layer of insulating material above said conformal second layer of insulating material;
    performing at least one etching process to form an opening in said conformal second layer of insulating material so as to expose at least a portion of said recessed upper surface of said recessed line-type source/drain contact structure; and forming said via such that it is conductively coupled to said exposed portion of said recessed line-type source/drain contact structure, said via being at least partially positioned in said opening in said conformal second layer of insulating material.

11. The method of claim 10, further comprising, after forming said line-type source/drain contact structure and prior to recessing said line-type source/drain contact structure, removing insulating material positioned adjacent an upper portion of said line-type source/drain contact structure and forming said first layer of insulating material adjacent said upper portion of said line-type source/drain contact structure.

12. The method of claim 10, wherein, after forming said third layer of insulating material and prior to performing said at least one etching process, the method further comprises forming an opening in said third layer of insulating material so as to expose a portion of said recessed upper surface of said conformal second layer of insulating material.

13. The method of claim 10, wherein forming said via comprises forming said via such that a portion of said via is positioned vertically above said gate cap layer of at least one of said two gate structures and above a portion of said conformal second layer of insulating material having said opening formed therein.

14. A method of forming a on an integrated circuit product comprised of two spaced-apart transistor gate structures, each of said gate structures having a gate cap layer with an upper surface, the method comprising:

forming a source/drain contact structure between said two spaced-apart transistor gate structures, wherein an upper surface of said source/drain contact structure is positioned at a first level that is above a level of said upper surfaces of said gate cap layers, said source/drain contact structure being positioned at least partially in a first layer of insulating material;

removing at least a portion of said first layer of insulating material;

forming a second layer of insulating material comprised of silicon nitride to replace the removed portions of said first layer of insulating material;

recessing said source/drain contact structure relative to an upper surface of said second layer of insulating material so as to define a recessed source/drain contact having a recessed upper surface that is positioned at a second level that is lower than said first level, wherein said recessing of said source/drain contact structure defines a source/drain contact etch cavity that is defined, at least in part, by said recessed upper surface of said recessed source/drain contact and said second layer of insulating material;

performing a conformal deposition process to deposit a conformal third layer of insulating material above said second layer of insulating material, in said source/drain contact etch cavity and on said recessed upper surface of said recessed source/drain contact;

forming a fourth layer of insulating material above said conformal third layer of insulating material;

performing at least one etching process to form an opening in said conformal third layer of insulating material so as to expose at least a portion of said recessed upper surface of said recessed source/drain contact; and forming said via such that it is conductively coupled to said exposed portion of said recessed source/drain contact structure, said via being at least partially positioned in said opening in said conformal third layer of insulating material.

\* \* \* \* \*